(12) United States Patent
Petrucci et al.

(10) Patent No.: US 9,509,339 B2
(45) Date of Patent: Nov. 29, 2016

(54) HIGH SPEED DATA COMMUNICATION IN A VEHICLE

(71) Applicant: GM Global Technology Operations LLC, Detroit, MI (US)

(72) Inventors: David R. Petrucci, Warren, MI (US); Charles A. Massoll, Milford, MI (US); David Heiden, Clarkston, MI (US); Duane S. Carper, Davison, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 7 days.

(21) Appl. No.: 14/294,659

(22) Filed: Jun. 3, 2014

(65) Prior Publication Data

US 2015/0343966 A1    Dec. 3, 2015

(51) Int. Cl.
*G08C 15/06* (2006.01)
*H03M 9/00* (2006.01)
*H04J 3/00* (2006.01)

(52) U.S. Cl.
CPC . *H03M 9/00* (2013.01); *H04J 3/00* (2013.01)

(58) Field of Classification Search
CPC ................................ H04L 67/12; D03B 9/00
USPC .................. 375/257, 357, 395, 316; 370/241
See application file for complete search history.

(56) References Cited

U.S. PATENT DOCUMENTS

| | | | |
|---|---|---|---|
| 2008/0147321 A1* | 6/2008 | Howard et al. ............... | 701/211 |
| 2009/0195217 A1* | 8/2009 | Choi ........................ | B60K 6/28 320/152 |
| 2011/0255411 A1* | 10/2011 | Isaac ................... | H04L 12/4625 370/241 |
| 2014/0218535 A1* | 8/2014 | Ihlenburg et al. ............ | 348/148 |

\* cited by examiner

*Primary Examiner* — David S Huang
(74) *Attorney, Agent, or Firm* — Christopher DeVries; Reising Ethington P.C.

(57) ABSTRACT

A system and method is provided for the high-speed transfer of data within a vehicle. The method includes the steps of: receiving at a high-speed transmitter non-video parallel data from a plurality of data sources in the vehicle; sampling the parallel data received from the plurality of data sources; serializing at the high-speed transmitter the parallel data from the plurality of data sources; and then transmitting via a low voltage differential signaling (LVDS) the parallel data to a high-speed receiver in the vehicle for deserialization while performing a sample and hold function as new parallel data is received at the high-speed transmitter during transmission, wherein the high-speed transmitter is configured to provide video data.

17 Claims, 6 Drawing Sheets

HIGH SPEED DATA COMMUNICATION IN A VEHICLE

TECHNICAL FIELD

The present invention relates to communicating high-speed data over a wired vehicle communication system.

BACKGROUND

Modern vehicles have a number of mechanical, electrical, or electro-mechanical sensors or detectors for enhancing the user-experience, improving user safety, performing vehicle diagnostics, etc., just to name a few examples. Some of these sensors may be discretely connected to a controller which may be further connected to a vehicle bus.

SUMMARY

According to an embodiment of the invention, there is provided a method of transferring data in a vehicle. The method includes the steps of: receiving at a high-speed transmitter non-video parallel data from a plurality of data sources in the vehicle; sampling the parallel data received from the plurality of data sources; serializing at the high-speed transmitter the parallel data from the plurality of data sources; and then transmitting via a low voltage differential signaling (LVDS) the parallel data to a high-speed receiver in the vehicle for deserialization while performing a sample and hold function as new parallel data is received at the high-speed transmitter during transmission, wherein the high-speed transmitter is configured to provide video data.

According to another embodiment of the invention, there is provided a method of transferring data in a vehicle. The method includes the steps of: receiving one or more pairs of non-video data at a serializer in the vehicle from a plurality of data sources, wherein a pair of data includes first data received via a first port of the serializer and second data received at a second port of the serializer, wherein the first and second data are associated with one of the plurality of data sources, wherein the serializer is configured to provide video data; serializing the one or more pairs of data at the serializer; transmitting the one or more pairs of data to a deserializer in the vehicle over a differential serial link; sampling and holding one or more new pairs of data received from the plurality of data sources during the serializing step, the transmitting step, or both; deserializing the earlier-transmitted one or more pairs of data; and error-checking the earlier-transmitted one or more pairs, wherein the error-checking includes comparing the first data to the second data using a mirroring technique or an inversion technique.

BRIEF DESCRIPTION OF THE DRAWINGS

One or more embodiments of the invention will hereinafter be described in conjunction with the appended drawings, wherein like designations denote like elements, and wherein.

DETAILED DESCRIPTION OF THE ILLUSTRATED EMBODIMENT(S)

The methods described below pertain to a data communication system within a vehicle. Conventionally, a vehicle's electrical communication architecture comprises data bus architecture having multiple modules connected thereto as well as discrete electrical connections, e.g., connecting various devices or sensors to a processing device or controller. The present disclosure discloses an architecture (or portion thereof) that reduces hardware cost, weight, and packaging constraints while maintaining desirable high-speed communication links with substantial through-put. According to some aspects of the disclosure below, various data sources, including vehicle sensors, multi-band antennas, and single-band antennas, may be electrically coupled to a high-speed transmitter (e.g., such as a serializer) which provides data or a data stream over a differential serial link to a high-speed receiver (e.g., a deserializer) that is positioned elsewhere in the vehicle. According to one embodiment of the disclosure, a sample and hold functionality of a serializer and a deserializer is utilized in order to continuously receive data from multiple data sources while serialized data is transmitted between the devices. According to another embodiment, the serializer receives duplicative or redundant data from at least one of the data sources, and after the original and redundant data passes over the differential serial link and is received by the deserializer, the redundant data is compared against the original data to error-check or validate the data.

Communications System—

Figure 1:
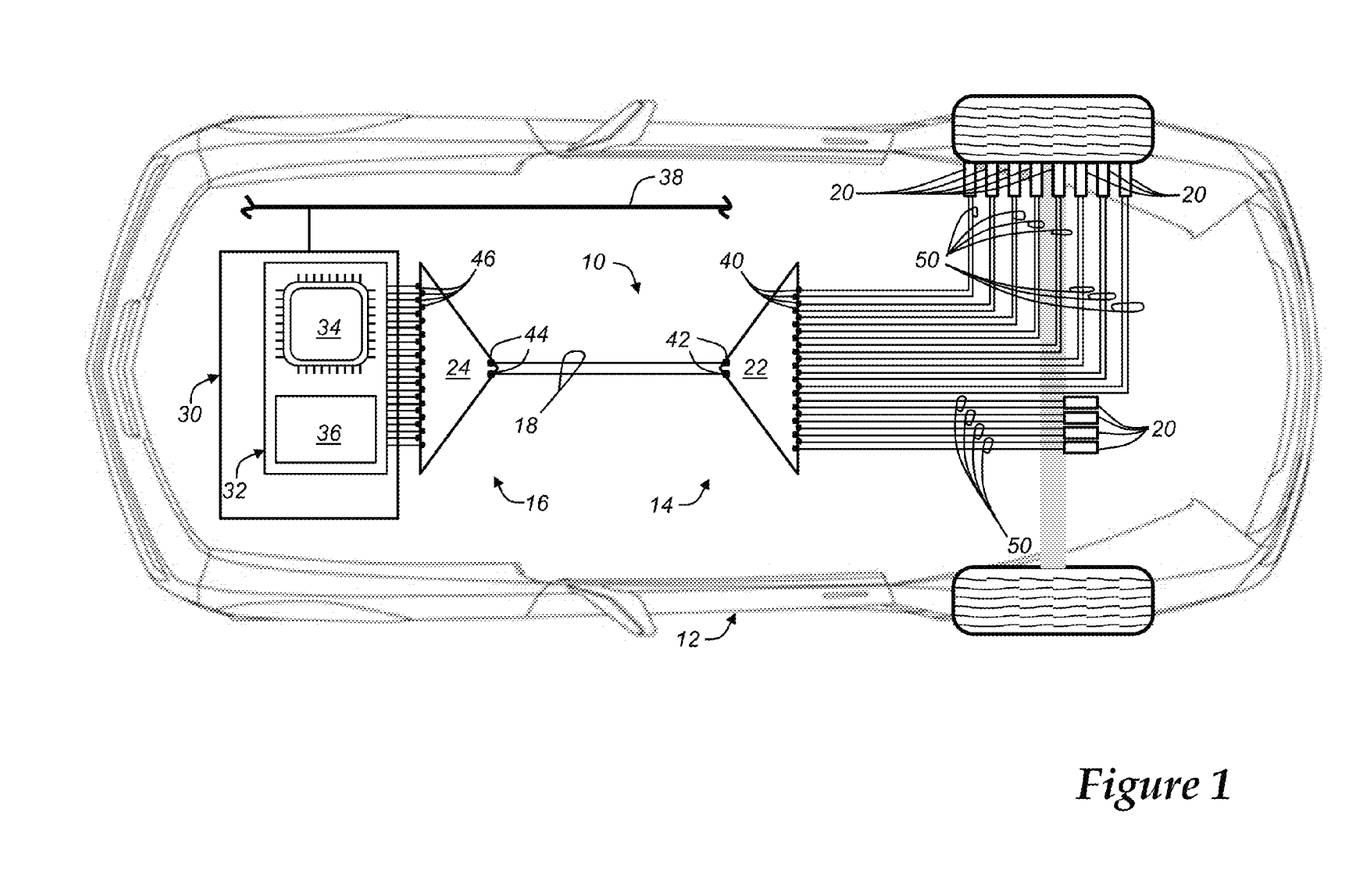
FIG. 1 is a schematic view depicting an embodiment of a vehicle communication system that is capable of utilizing the method(s) disclosed herein.

FIG. 1 illustrates an example of a data communication system 10 in a vehicle 12. The system 10 includes an uplink portion 14 and a downlink portion 16 electrically coupled via a differential serial link 18. The uplink portion 14 includes a high-speed transmitter 22 for receiving data from multiple data sources 20, and the downlink portion 16 includes a high-speed receiver 24 for receiving the data via the serial link 18. The receiver 24 is shown electrically coupled to an electronic control unit (ECU) 30 that includes a processing unit 32 which has a processor 34 and memory 36 coupled to one another for processing the data received via the receiver 24. The ECU 30 is coupled to a bus 38 which may be used for vehicle communication data, entertainment data, etc., as will be appreciated by skilled artisans. In general, the system 10 may be used to receive data from a variety of data sources 20—which at least in some embodiments are somewhat proximately located with respect to one another—and transmit the data over the link 18 at high-speed to the remote receiver 24 and ECU 30.

The vehicle 12 of FIG. 1 is depicted in the illustrated embodiment as a passenger car, but it should be appreciated that any other vehicle including motorcycles, trucks, sports utility vehicles (SUVs), recreational vehicles (RVs), marine vessels, aircraft, etc., can also be used. The vehicle 12 may have multiple communication systems 10 therein; the embodiments of the uplink and downlink portions 14, 16 that follow are merely examples.

According to at least one implementation, the transmitter and receiver 22, 24 of the data communication system 10 are a serializer and deserializer, respectively; thus, the transmitter and receiver 22, 24 may be paired as a serializer/deserializer or SerDes pair. As will be appreciated by skilled artisans, a serializer may have multiple, parallel input ports 40 and two differential output ports 42. Similarly, the deserializer may have two differential input ports 44 and multiple, parallel output ports 46. According to one embodiment, the serializer may be configured to receive parallel input data via ports 40, configure the parallel data in real-time to a serialized format, and then transmit the parallel data (now in the serialized format) to the deserializer via ports 42—while continuously receiving new parallel input data via input ports 40. This serializer may accomplish this by means of a sample and hold functionality, which will be explained in greater detail below. Moreover, in some embodiments, the serialization (i.e., at the serializer) may be performed without the use of a processing unit (e.g., such as processing unit 32). And in one embodiment, the serializer utilizes a clock 48 to facilitate the communication (e.g., the clock 48 may be coupled to or may be a part of (e.g., embedded within) the serializer). The deserializer may be configured to receive this parallel data via its differential input ports 44, configure the parallel data to a parallel format again, and then provide the parallel data via its parallel output ports 46. In FIG. 1, this data is provided to the ECU 30—e.g., to the processing unit 32. The serialization of parallel data and deserialization of the data to a parallel format is known.

The differential serial link 18 may receive and carry the parallel data (now serialized) as an electrical signal between the output ports 42 of the serializer and the input ports 44 of the deserializer. According to at least one implementation, this electrical signal may conform to low voltage differential signaling (LVDS). Thus, the electrical signal may be defined by one or more differential electrical parameters readable by the deserializer. Differential electrical parameters include voltage and current. LVDS is known, and neither the magnitudes of the parameters (voltage and/or current) nor other aspects of LVDS will be explained in detail herein. In addition, the differential serial link (e.g., a differential pair such as a twisted wire pair) is known as well.

Both the serializer and deserializer may be considered high-speed or as having high through-put, as those terms are understood in the art. For example, the SerDes pair may be configured to transmit/receive at Gigabit, multi-Gigabit, or faster speeds. In addition, the SerDes pair may have corresponding input and output ports. For example, the index positions and quantity of input ports 40 on the serializer may correspond to the index positions and quantity of output ports 46 on the deserializer.

One commercially available implementation of the serializer is the DS90UR905Q and one commercially available implementation of the deserializer is the DS90UR906Q, both manufactured by Texas Instruments. This SerDes pair is configured to translate a parallel red-green-blue (RGB) video interface into a high-speed serialized interface over a single differential link (i.e., a two wire pair) to ten or more meters in length. The speed of video data transmission is configurable between 140 Megabits per second (Mbps) and 1.82 Gigabits per second (Gbps). The parallel interfaces of the serializer and the deserializer each dedicate twenty-four ports for video (8 red inputs or outputs, 8 green inputs or outputs, and 8 blue inputs or outputs) and six additional dedicated ports for video control (Serializer: horizontal sync (HS) input, vertical sync (VS) input, data enable (DE) input, pixel clock input (PCLK) input; and Deserializer: horizontal sync (HS) output, vertical sync (VS) output, data enable (DE) output, pixel clock output (PCLK) input, lock (LOCK) output, and pass (PASS) output). The serializer is configured to embed the clock, balance the RGB payload, and level shift the electrical signals associated with the RGB payload to high-speed LVDS. And the deserializer is configured to recover the RGB payload, recover the video controls signals, and extract the clock from the differential serial link. The serializer utilizes an input latch, phase lock loop (PLL), a timing/control module, and a pattern generator while the deserializer utilizes an output latch, an error-detection module, a clock and video data recovery module, and a timing/control module. The deserializer is capable of locking the incoming video data without the use of a training sequence, special sync patterns, or a reference clock. Other commercially available implementations exist within the video data SerDes family (by Texas Instruments), including a 48-pin Very Very Thin Quad Flat No-leads package (WQFN) serializer and a 60-pin WQFN deserializer. Skilled artisans will recognize that the DS90UR905Q/906Q pair is designed and configured for the serialization of 18-bit (high color) or 24-bit (true color) video data (and the 48-pin, 60-pin packages enabling 30-bit or 36-bit deep color).

The present disclosure may utilize a SerDes pair such as the described commercially available implementation to transmit non-video data in the vehicle. The RGB video ports are utilized for sensor data inputs, antenna data inputs, etc. (as will be explained more below). Moreover, the length of the differential serial link is suitable for many vehicle applications as the length may vary up to approximately ten meters or more.

Figure 6:
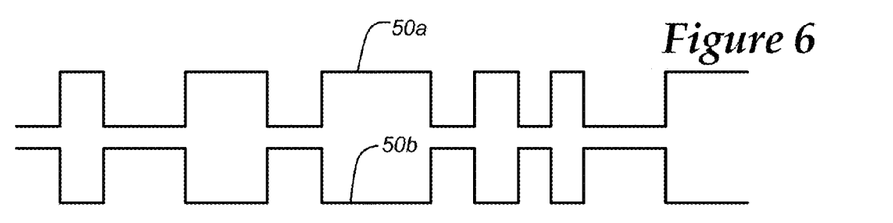
FIG. 6 is an illustrative pair of data signals where one signal is the inversion of the other.

In the illustrated example of FIG. 1, the uplink portion 14 not only comprises the serializer, but also multiple data sources 20 associated with the vehicle's rear axle and wheels that are electrically coupled to the serializer's input ports 40 via one or more electrical connections 50. If desired, each connection 50 may comprise two separate couplings—e.g., an original or fundamental data connection 50a and a redundant or duplicative data connection 50b (see also FIG. 2), although this is not required. In some instances, the parallel data carried by the original connection 50a may mirror or be identical to the parallel data carried by the redundant connection 50b (e.g., see FIG. 5); in other instances, the redundant connection 50b may carry the parallel data in an inverted form (e.g., see FIG. 6). In any instance, the connection 50 may carry at least a pair of data (via 50a, 50b) for error-checking and validation, as explained below.

In FIG. 1, the data sources 20 are illustrated as data sensors at or near the axle and wheels (e.g., for sensing movement (e.g., accelerometer(s), gyroscope(s), etc.), temperature, pressure, proximity, just to name a few examples). Each sensor is shown having a single electrical connection 50; however, other implementations exist. For example, a single sensor may have multiple connections 50; e.g., a tri-axial accelerometer may have three connections 50—one for each axis.

Figure 2:
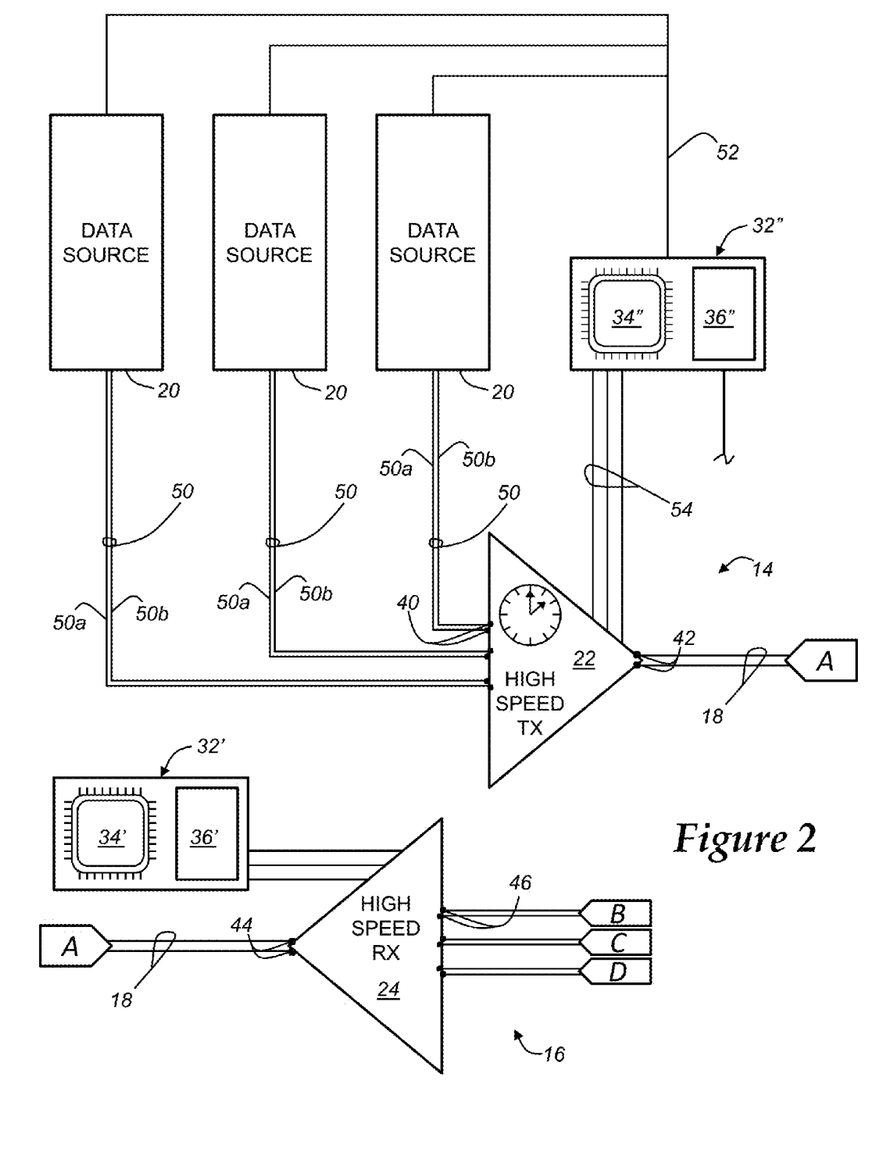
FIG. 2 is a schematic view of another embodiment of the communication system.

Turning now to FIG. 2, there is shown a schematic view of another embodiment of the present disclosure. Here, the uplink portion 14 is shown having multiple data sources 20 coupled via connections 50 to the transmitter 22 which is coupled via the serial link 18 to the downlink portion 16 comprising the receiver 24 and a processing unit 32'. In this implementation, ECU 30 is not shown; instead, the processing unit 32' controls the receiver 24. Thus, as the processing unit 32' is not coupled to the output ports 46 (as shown in FIG. 1), the unit 32' may cooperate with the receiver 24 to receive the (serialized) parallel data, control signals, and thereafter deserialize the data. The output ports 46 may lead to various electrical input ports of other devices (e.g., B, C, D)—which may be separate devices, the same device, or a combination of the two.

FIG. 2 also illustrates that the uplink portion 14 comprises a processing unit 32" that is individually coupled to the data sources 20 via communication link 52 and further coupled to the transmitter 22 via communication link 54. The processing unit 32" may control the transmission of data from the sources 20—e.g., unit 32" may control the parallel data being sent to the transmitter 22 (controlling, for example, any enabling, inhibiting, delaying or lagging, etc.). Also, the processing unit 32" may control the transmitter 22—e.g., by regulating the receipt of the parallel data from the sources 20, the serialization thereof, the transmission thereof, and/or the sampling and holding functionality thereof. As the processing unit 32" is coupled to both, it may coordinate an efficient operation of both. The processing unit 32" is not necessary in all implementations however; i.e., the transmitter 22 may operate without the unit 32" to receive parallel data from the data sources 20, serialize, and transmit.

While FIGS. 1 and 2 illustrate different quantities of data sources 20, different quantities of input ports 40 (transmitter 22), and different quantities of output ports 46 (receiver 24), these quantities should be understood to merely provide examples. The quantities may vary—some implementations having more or less than those shown.

Figures 3, 5:
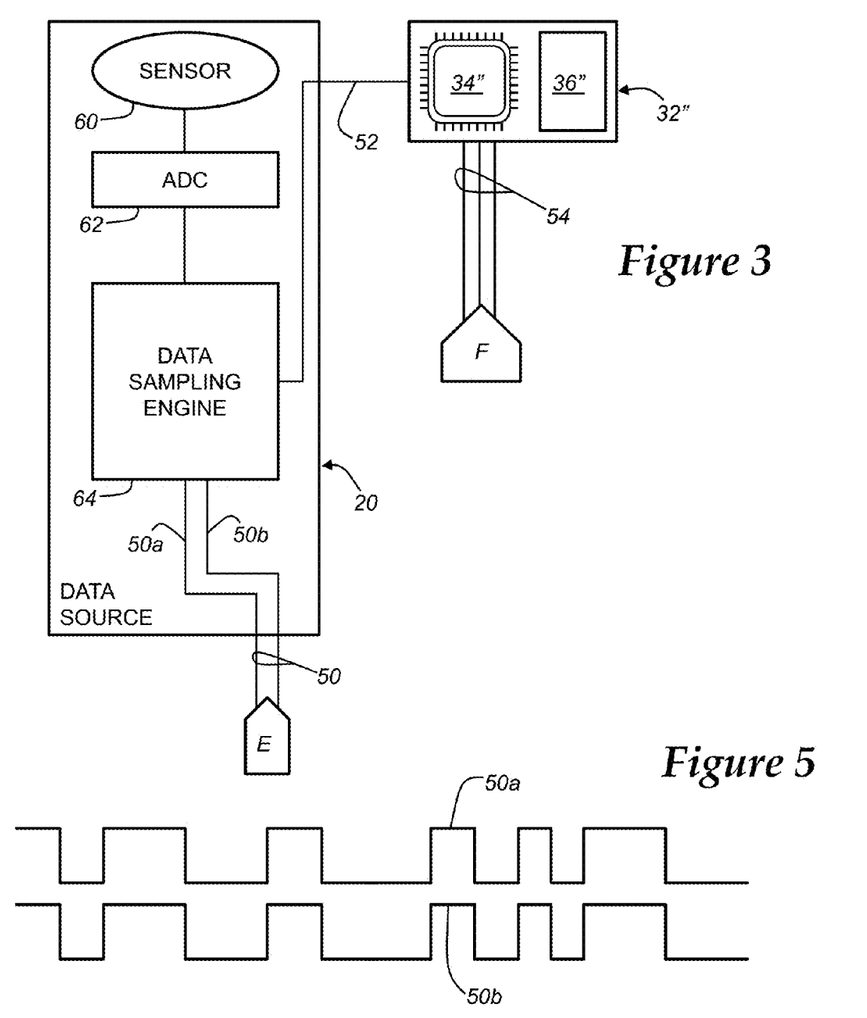
FIG. 3 is a schematic view of an embodiment of a data source of the communication system shown in FIG. 2.
FIG. 5 is an illustrative pair of data signals that mirror one another.

FIG. 3 illustrates a schematic view of an embodiment of the data source 20 of FIG. 2. The data source 20 may comprise a sensor 60 coupled to an ADC or analog-to-digital-converter 62 which is further coupled to a data sampling engine 64. The sampling engine 64 may be any device capable of sampling data being received from the sensor 60 (via the ADC 62) at a rate suitably compatible with the transmitter 22. The sampling engine 64 may be coupled to and/or controlled by the processing unit 32" when suitably desirable. Also, the sampling engine 64 may couple to connections 50a, 50b which are ultimately coupled to the transmitter 22 (via E). Vehicle sensors are known to skilled artisans; e.g., the sensors 60 may be similar to those previously described and shown in FIG. 1 or may be any other suitable sensor. Further, the ADC 62 and sampling engine 64 are merely illustrative; other devices having similar functionality may be used. For example, in some instances, the sampling engine may be part of the serializer—e.g., the sampling occurs only once. In other instances, the serializer samples the parallel data received from the sampling engine 64; i.e., the parallel data is sampled twice.

Method—

Now turning to a method 400 of implementing the communication system 10 as shown in FIG. 5, the method begins with step 410 wherein the high-speed transmitter 22 (e.g., the serializer) receives one or more pairs of data or data streams (e.g., a pair including first data and second data). Step 410 may include the sensor 60 receiving a vehicle-induced or environmentally-induced input; e.g., a mechanical input received by the sensor 60 may be transduced to an analog, electrical signal that is received by the ADC 62. Step 410 may include the ADC digitizing the signal, providing the digitized signal to the data sampling engine 64, the engine 64 generating a pair of electrical, parallel data (the first and second data) based on the digitized signal; and transmitting the pair via one connection 50 (e.g., 50a and 50b) to two different input ports 40 of the serializer. The first data may be 'original' data (carried by connection 50a) and the second data may be 'redundant' data (carried by connection 50b). The sampling engine 64 may be preconfigured to generate or not generate the redundant data (i.e., identical or inverted data). In some instances, the processing unit 32" may store the redundant data configuration in memory 36" and/or control the sampling engine 64 using the processor 34".

In any instance, each sensor 60 may provide its own pair of data to the serializer substantially as mechanical inputs occur (i.e., at each individual sensor 60). Thus, the serializer may receive sets of paired data—i.e., a data set may be pairs of data received simultaneously or nearly so. Then, the method 400 proceeds to step 420.

Figure 4:
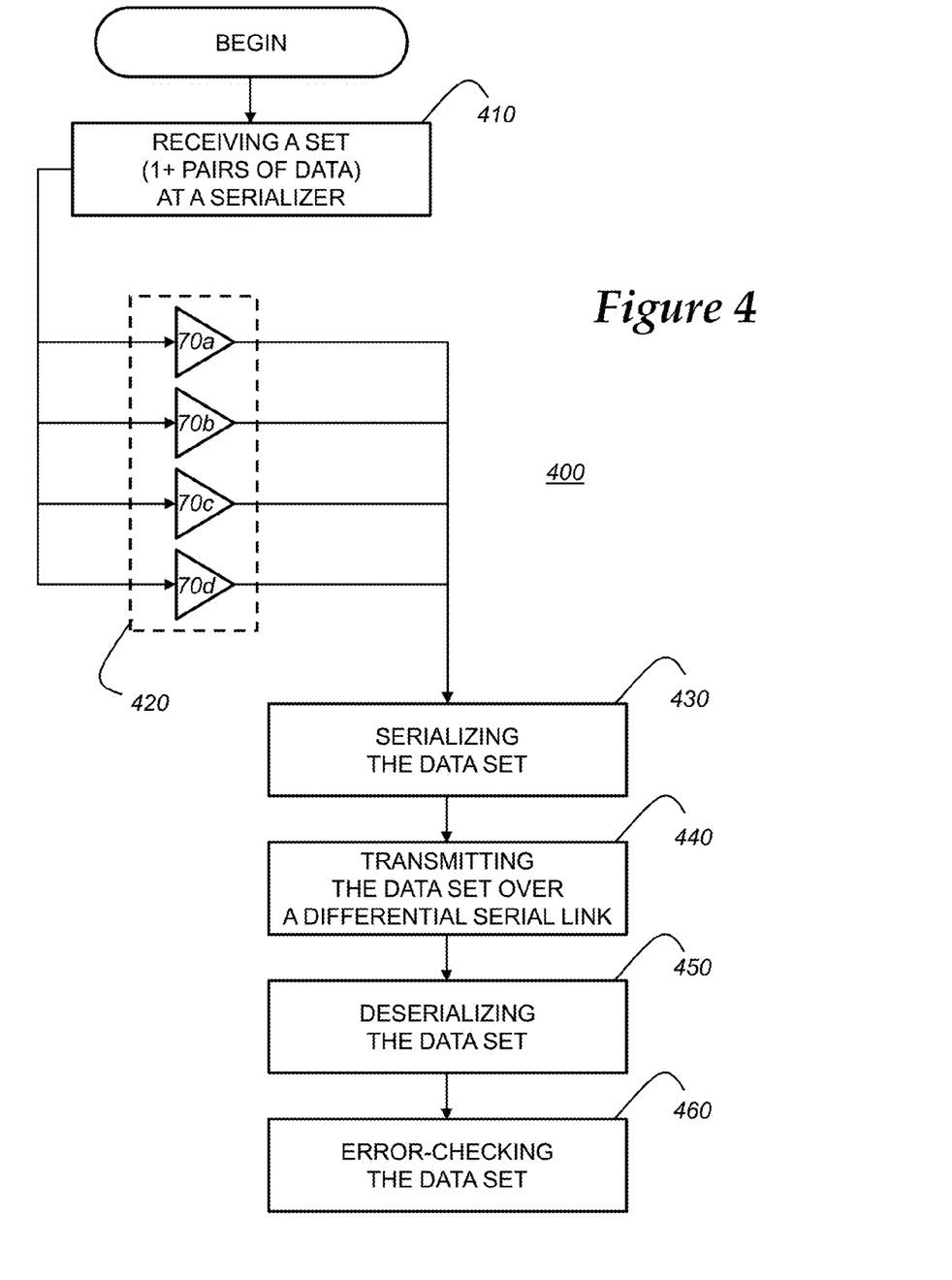
FIG. 4 is a flow diagram illustrating a method of using the vehicle communication system described herein.

In step 420, the serializer may or may not sample the data set (depending on whether it is desirable to sample the data a second time). Where necessary, the serializer may latch and/or hold the sampled data set (e.g., depicted in FIG. 4 as buffers). FIG. 5 illustrates four buffers 70a, 70b, 70c, 70d; however, this is merely an example. The serializer may have more or fewer buffers for temporarily holding the data sets. In step 420, the most recent or 'current' data set passes through the respective buffer to be serialized in step 430.

In step 430, the serializer 'serializes' the current data set by converting all of the parallel data into a serialized format and by adding any suitable serialized control data (e.g., including a timestamp obtained via the embedded clock 48). For example, where twelve sensors 60 are coupled to the serializer, each having original and redundant data connections 50a, 50b, the data set will include twenty-four units of parallel data to sample and hold (as necessary). Skilled artisans are familiar with serialization techniques, including serialization rates, clocking, timestamps, etc. After step 430, the method proceeds to step 440.

In step 440, the serializer transmits the current data set over the differential serial link 18 to the receiver 24 (e.g., the deserializer). In one embodiment, the transmission uses low voltage differential signaling (LVDS) and any suitable protocol may be used with the serializer and deserializer (e.g., 8B/10B, NRZ, NRZ-I, just to name a few examples).

In step 450, the current data set and control data are received by the deserializer. The electrical parameters of the transmission (e.g., changes in voltage and/or current) are interpreted to extract the parallel data and control data (e.g., the timestamp) during deserialization. Deserialization includes converting the now serialized data again into a parallel format (i.e., parallel data again). Further, deserialization may include latching the parallel data (e.g., using a sample and hold function). This deserialized data is made available at the output ports 46 of the deserializer. The parallel data provided at the output ports 46 may correspond with the parallel data provided to the input ports 40 of the serializer (e.g., index positions and quantity). In addition, not all of the input and output ports 40, 46 may be utilized in every application.

In step 460, the deserialized data set may be error-checked or validated. To validate, the pairs of data within the set may be identified and compared to one another. If for example, the redundant data is expected to be identical (or nearly so) to the original data of the pair, the method may determine whether the pair of data (e.g., from the sensor 60) is acceptable or not. Similarly, for example, the redundant data is expected to be an inversion of the original data of the pair (or nearly so), the method may determine whether the pair of data (e.g., from the sensor 60) is acceptable or not. It should be appreciated that the error-checking step may indicate a lack of integrity at various failure points in the communication system 10; e.g., a lack of integrity at the sensor, at the sampling engine, at the processing unit (when implemented), at the serializer, during transmission over the serial link, or at the deserializer, just to name a few examples. It should also be appreciated that embodiments exist where no redundant data is transmitted; therefore, validation may not occur or may occur via other known means.

The validation of step 460 may utilize the deserializer or another device (e.g., such as the processing unit 32'). In at least one embodiment, step 460 occurs within the deserializer and prior to providing the parallel data at the output ports 46 (in step 450). In other embodiments, another device performs step 460 after the parallel data is provided at the output ports 46.

The method may be continuously operated; i.e., while steps 430, 440, 450, and/or 460 are being performed, steps 410 and 420 may continue proceeding. This may be accomplished using the multiple buffers (e.g., 70a, 70b, 70c, 70d, etc.).

Alternative embodiments also exist. For example, in one implementation, the pair of data carried by 50a, 50b may be used to reconstruct the original data instead of validate the original data. Similarly, instead of a single redundant data, there may be two or three or more. Again, multiple redundancies may better enable the reconstruction of the original data.

Figure 7:
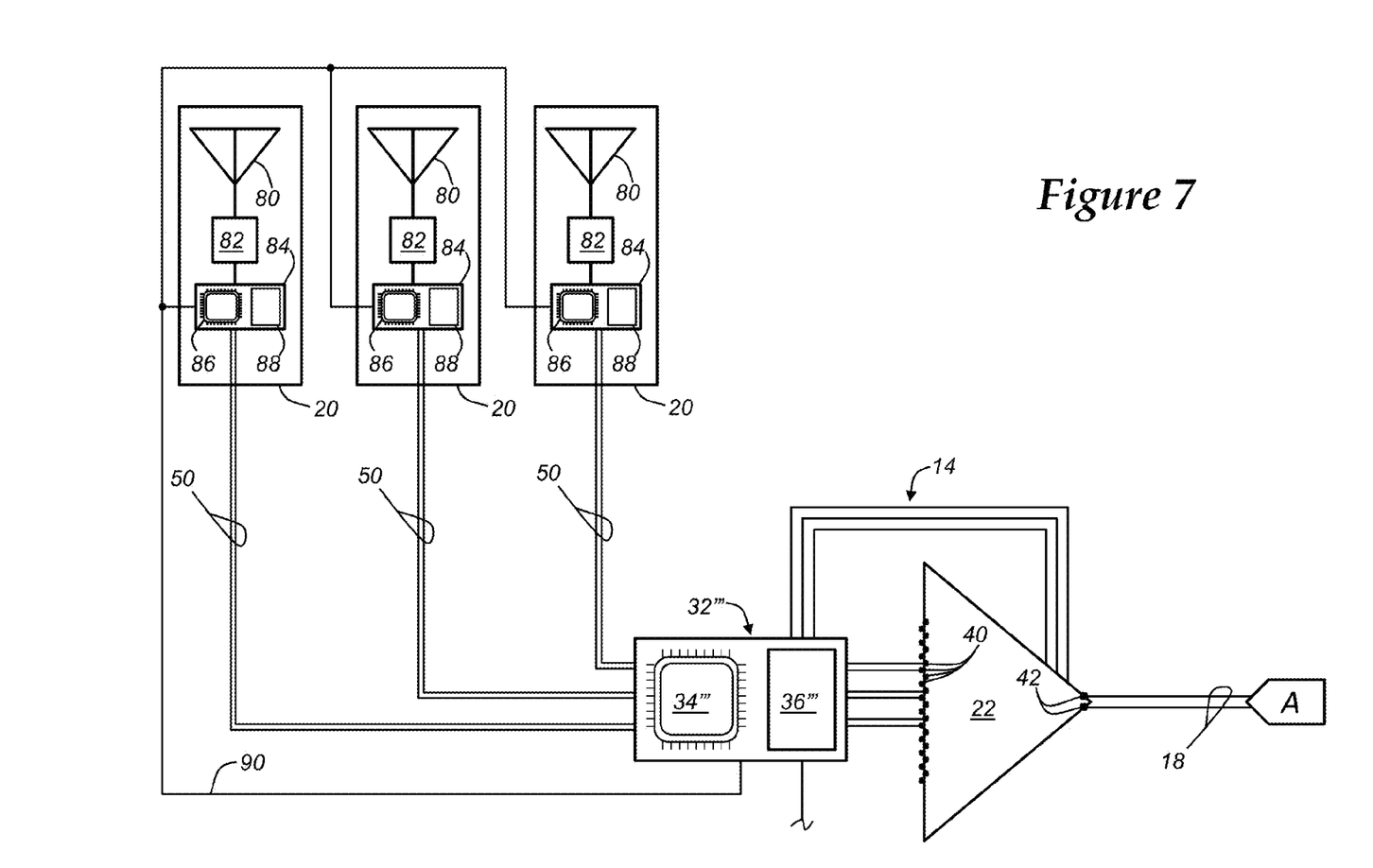
FIG. 7 is a schematic view of another embodiment of the communication system.

FIG. 7 illustrates a schematic view of another alternative embodiment. More specifically, FIG. 7 shows only the uplink portion 14. Here, the uplink portion includes data sources 20 coupled to a master processing unit 32''' which is further coupled to the transmitter 22 (e.g., the serializer). The unit 32''' provides parallel data from the data sources 20 to the serializer. In this implementation, the data sources 20 include an antenna 80 electrically coupled to a low noise amplifier (LNA) 82 (which may also include an ADC) which is electrically coupled to a slave processing unit 84 (that comprises a processor 86 coupled to memory 88). Each slave unit 84 may have a connection 50 with the master unit 32''' as well as a communication link 90.

According to one illustrative embodiment, the antennas 80 are associated with different radio frequency (RF) bands. As used herein, the RF bands may be defined by the International Telecommunications Union (ITU). For example, each of the antennas may be configured to receive wireless signals from one of the following bands: very low frequency (VLF) [3-30 kHz], low frequency (LF) [30-300 kHz], medium frequency (MF) [300-3000 kHz], high frequency (HF) [3-30 MHz], very high frequency (VHF) [30-300 MHz], ultra high frequency (UHF) [300-3000 MHz], super high frequency (SHF) [3-30 GHz], extremely high frequency (EHF) [30-300 GHz], or tremendously high frequency (THF) [300-3000 GHz], just to name a few. Other ITU bands are also possible.

In one embodiment (shown in FIG. 7), there is provided an array of multi-band antennas; i.e., at least two of the antennas 80 are in different RF bands. In another implementation, each of the antennas is in a different RF band. In another arrangement, the antennas 80 are proximately located to one another in the vehicle 12. Other arrangements also are possible.

Figure 8:
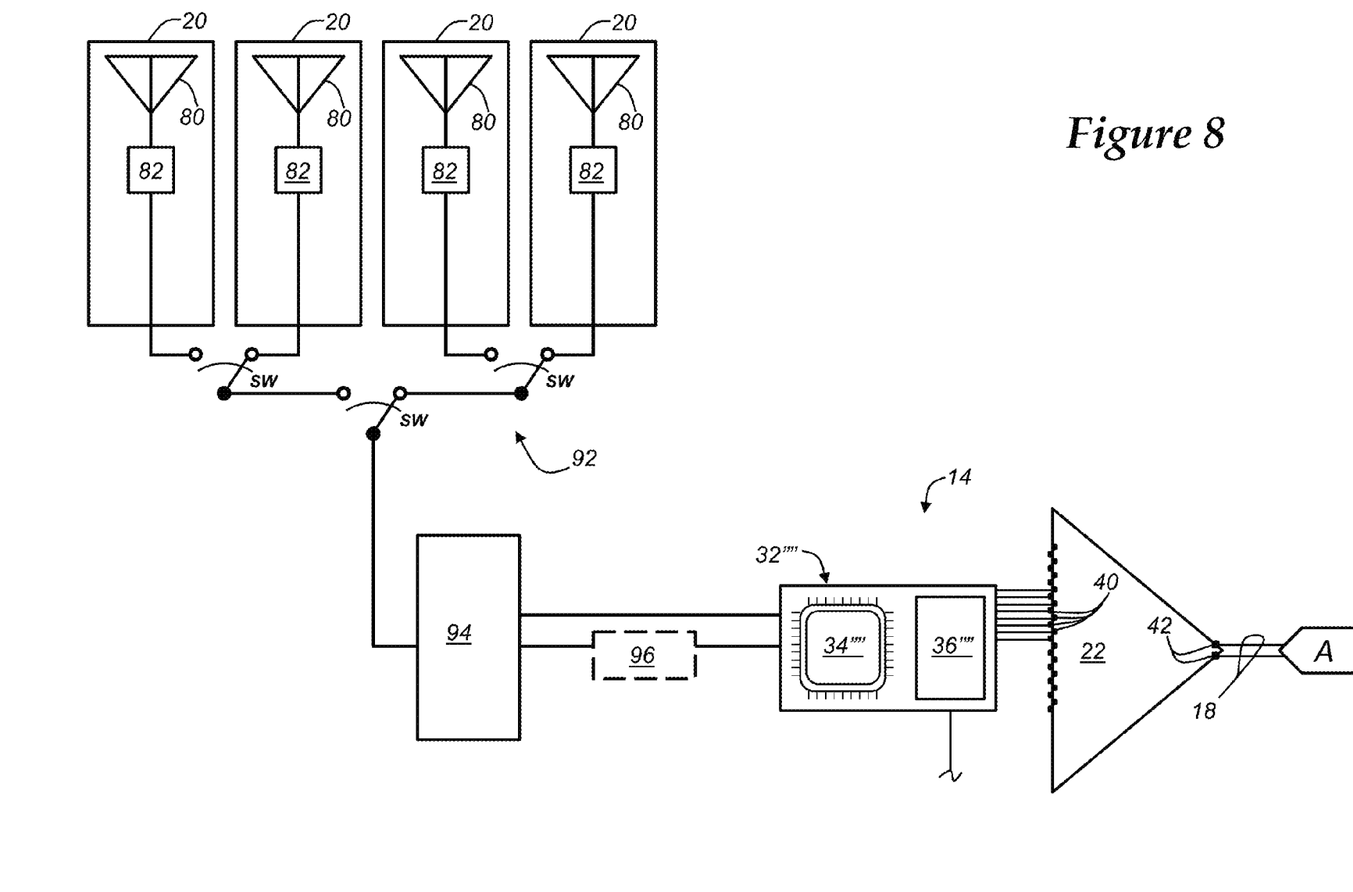
FIG. 8 is a schematic view of another embodiment of the communication system.

FIG. 8 illustrates a schematic view of another alternative embodiment showing only the uplink portion 14. As in the previous embodiment, the data sources 20 include antennas 80 and LNAs 82. Each of the data sources 20 are coupled to a switch network 92, and the switch network is coupled to a GPS receiver 94 which is in direct communication with a processing unit 32'''' that provides parallel data to the serializer. Alternatively, the receiver 94 may be indirectly coupled to the unit 32'''' via a communication link 96 that converts the GPS receiver output to a suitable format for the unit 32'''' when necessary.

In the embodiment shown in FIG. 8, the antennas 80 may be an array of common- or single-band antennas; i.e., the antennas may be configured to receive wireless signals in the same band. In the implementation shown, the GPS antennas 80 may be configured to receive UHF; however, this is merely an example. Other common-band antenna arrays also are possible.

Thus, there have been disclosed various implementations a vehicle communication system using paired transmitters and receivers. The transmitters and receivers may include a serializer and deserializer pair. The transmitter (e.g., the serializer) may receive non-video parallel data from a plurality of data sources that include sensors, multi-band antennas, and common-band antennas. The present architecture minimizes the need for discrete wiring in the vehicle, while providing the benefits of discrete signaling—as the communication system may operate at high-speed and with high integrity.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A method of transferring data in a vehicle, comprising the steps of:
    receiving at a high-speed transmitter non-video parallel data from a plurality of data sources in the vehicle;
    sampling the parallel data received from the plurality of data sources;
    serializing at the high-speed transmitter the sampled parallel data from the plurality of data sources; and then
    transmitting via a low voltage differential signaling (LVDS) the serialized parallel data to a high-speed receiver in the vehicle for deserialization while performing a sample and hold function as new parallel data is received at the high-speed transmitter during transmission, wherein the high-speed transmitter is configured to provide video data.

2. The method of claim 1, wherein the transmitter is a serializer and the receiver is a deserializer.

3. The method of claim 1, wherein the serialized parallel data is transmitted over a differential serial link, and further comprising determining at the high-speed receiver a differential electrical parameter based on the transmission over the serial link.

4. The method of claim 1, wherein the high-speed transmitter has a plurality of input parallel ports for receiving the parallel data from the plurality of data sources, wherein the high-speed receiver has a plurality of output parallel ports corresponding to the plurality of input parallel ports of the high-speed transmitter.

5. The method of claim 4, wherein a portion of the parallel data received at the high-speed transmitter includes first parallel data and second parallel data, wherein the first parallel data is received at one parallel port and the second parallel data is received at another parallel port, wherein the second parallel data corresponds to the first parallel data for redundancy.

6. The method of claim 5, wherein the second parallel data is one of a mirror of the first parallel data or an inversion of the first parallel data.

7. The method of claim 5, further comprising:
after the transmitting step, receiving the serialized parallel data at the high-speed receiver;
deserializing the serialized parallel data at the high-speed receiver; and then
validating the deserialized parallel data.

8. The method of claim 7, wherein the validating step further comprises determining the integrity of at least the deserialized first parallel data by comparing it to the deserialized second parallel data.

9. The method of claim 1, wherein the receiving, sampling, serializing, and transmitting steps are performed without the use of a processing unit.

10. The method of claim 1, wherein at least one of the plurality of data sources is coupled to a processing unit that comprises a processor coupled to memory, the processing unit also coupled to the high-speed transmitter.

11. The method of claim 10, wherein the serializing step is controlled using the processor, wherein the processor is in communication with a data sampling engine, the high-speed transmitter, or both the data sampling engine and the high-speed transmitter.

12. The method of claim 1, wherein the plurality of data sources includes an array of sensors coupled to one or more data sampling engines.

13. The method of claim 1, wherein the plurality of data sources includes an array of multi-band antennas.

14. The method of claim 1, wherein the plurality of data sources includes an array of common-band antennas.

15. A method of transferring data in a vehicle, comprising the steps of:
receiving one or more pairs of non-video data streams at a serializer in the vehicle from one or more of a plurality of data sources, wherein a pair of non-video data streams includes first data received via a first port of the serializer and second data received at a second port of the serializer, wherein the first and second data are associated with one of the plurality of data sources, wherein the serializer is configured to provide video data;
serializing the one or more pairs of non-video data streams at the serializer;
transmitting the one or more pairs of serialized non-video data streams to a deserializer in the vehicle over a differential serial link;
sampling and holding one or more new pairs of non-video data streams received from the one or more of a plurality of data sources during the serializing step, the transmitting step, or both;
deserializing the transmitted one or more pairs of serialized non-video data streams; and
error-checking the deserialized non-video data streams, wherein the error-checking includes comparing the first data to the second data using a mirroring technique or an inversion technique.

16. The method of claim 15, wherein the plurality of data sources include: one or more vehicle sensors, an array of vehicle multi-band antennas, and an array of vehicle single-band antennas.

17. The method of claim 15, wherein the differential serial link is a twisted wire pair, wherein the deserializing step further comprises determining a differential electrical parameter based on the transmission over the serial link.

* * * * *